(12) United States Patent
Jeong et al.

(10) Patent No.: US 8,698,215 B2
(45) Date of Patent: Apr. 15, 2014

(54) TRANSPARENT THIN FILM TRANSISTOR, AND METHOD OF MANUFACTURING THE SAME

(75) Inventors: Jae-Kyeong Jeong, Suwon-si (KR); Hyun-Soo Shin, Suwon-si (KR); Yeon-Gon Mo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1505 days.

(21) Appl. No.: 11/763,373

(22) Filed: Jun. 14, 2007

(65) Prior Publication Data

US 2008/0166475 A1   Jul. 10, 2008

(30) Foreign Application Priority Data

Jan. 8, 2007  (KR) .......................... 10-2007-0002172

(51) Int. Cl.
*H01L 29/76*   (2006.01)
(52) U.S. Cl.
USPC .................................. 257/288; 257/E29.13
(58) Field of Classification Search
USPC ............................. 257/59, 288, 614, E29.13
See application file for complete search history.

(56) References Cited

U.S. PATENT DOCUMENTS

| 6,362,507 | B1 | 3/2002 | Ogawa et al. | |
|---|---|---|---|---|
| 7,411,211 | B1 | 8/2008 | Yamazaki | |
| 2002/0039814 | A1* | 4/2002 | Jada et al. | 438/155 |
| 2003/0003616 | A1* | 1/2003 | Ikuta | 438/30 |
| 2003/0032221 | A1 | 2/2003 | Kasahara et al. | |
| 2005/0062134 | A1* | 3/2005 | Ho et al. | 257/614 |
| 2006/0001092 | A1 | 1/2006 | Kim | |
| 2006/0113539 | A1* | 6/2006 | Sano et al. | 257/59 |
| 2006/0113549 | A1* | 6/2006 | Den et al. | 257/79 |
| 2006/0244107 | A1 | 11/2006 | Sugihara et al. | |
| 2007/0178672 | A1 | 8/2007 | Tanaka et al. | |

FOREIGN PATENT DOCUMENTS

| JP | 2005-033172 | 2/2005 |
|---|---|---|
| KR | 2001-0014785 | 2/2001 |
| KR | 2001-0015419 | 2/2001 |
| KR | 2003-0004111 | 1/2003 |
| KR | 10-2006-0001322 | 1/2006 |
| KR | 10-2007-0069187 | 7/2007 |

OTHER PUBLICATIONS

KIPO Notice of Allowance dated Nov. 26, 2007, for Korean priority Patent application 10-2007-0002172, (4 pages).

* cited by examiner

*Primary Examiner* — Kimberly Rizkallah
*Assistant Examiner* — Duy T Nguyen
(74) *Attorney, Agent, or Firm* — Christie, Parker & Hale, LLP

(57) ABSTRACT

A thin film transistor (TFT) and a method of manufacturing the same such that an ohmic contact can be formed between a semiconductor layer and a source electrode or between the semiconductor layer and a drain electrode, wherein the TFT can be applied to a plastic substrate. The TFT includes: a substrate; an active layer formed of ZnO, InZnO, ZnSnO, and/or ZnInGaO on the substrate and including a channel region, a source region, and a drain region; a gate electrode insulated from the active layer; and source and drain electrodes insulated from the gate electrode and electrically connected to the source region and the drain region, respectively, wherein the source region and the drain region of the active layer include hydrogen.

2 Claims, 5 Drawing Sheets

TRANSPARENT THIN FILM TRANSISTOR, AND METHOD OF MANUFACTURING THE SAME

CROSS-REFERENCE TO RELATED PATENT APPLICATION

This application claims priority to and the benefit of Korean Patent Application No. 10-2007-0002172, filed on Jan. 8, 2007, in the Korean Intellectual Property Office, the entire content of which is incorporated herein by reference.

BACKGROUND OF THE INVENTION

1. Field of the Invention

The present invention relates to a thin film transistor (TFT) and a method of manufacturing the same.

2. Description of the Related Art

A thin film transistor (TFT) is a transistor that uses a semiconductor material as an active layer. Recently, research is being conducted on TFTs that are included in a pixel area of a flat display device, such as an organic light emitting display device, so that light can pass through a TFT and be output to the outside.

Conventionally, the electrical contact between a source electrode and a semiconductor layer of a TFT, or between a drain electrode and the semiconductor layer of the TFT is an important factor for defining the characteristics of the TFT. Accordingly, in a conventional silicon TFT using a silicon semiconductor layer as an active layer, the silicon semiconductor layer is doped to increase the electrical contact (e.g., to decrease a resistance ohmic contact) between the source electrode and the silicon semiconductor layer, or between the drain electrode and the silicon semiconductor layer, thereby improving the characteristics of the conventional silicon TFT.

However, as discussed above, research is being conducted on a TFT using a semiconductor material as an active layer that can be applied to a structure in which light can pass through the TFT that is included in a display unit so that the light is output to the outside. In such TFT, the electrical contact between the source electrode and the active layer or between the drain electrode and an active layer should be further increased.

In a TFT, an oxide semiconductor can provide a relatively low resistance ohmic contact (of $10^{-5}$ $\Omega cm^2$ or less) that is formed between the oxide semiconductor and the source and drain electrodes. To this end, a dopant such as Ga or Al may be applied through an ion injection process such as silicon doping; however, the temperature of the activation process in this case is 500° C. or higher. Thus, due to this high temperature, the oxide semiconductor cannot be applied to a plastic substrate in order to realize a flexible flat display device.

SUMMARY OF THE INVENTION

An aspect of an embodiment of the present invention is directed to a thin film transistor (TFT) and a method of manufacturing the same such that an ohmic contact can be formed between source and drain electrodes and a semiconductor layer, and the TFT can be applied to a plastic substrate.

An aspect of an embodiment of the present invention is directed to a TFT and a method of manufacturing the same such that an ohmic contact can be formed between source and drain electrodes and an active layer According to an embodiment of the present invention, there is provided a thin film transistor (TFT) including: a substrate; an active layer disposed on the substrate and having a channel region, a source region, and a drain region, the active layer including a material selected from the group consisting of ZnO, InZnO, ZnSnO, and ZnInGaO; a gate electrode insulated from the active layer; a source electrode insulated from the gate electrode and electrically connected to the source region of the active layer; and a drain electrode insulated from the gate electrode and electrically connected to the drain region of the active layer, wherein the source region and the drain region of the active layer include hydrogen.

In one embodiment, a concentration of hydrogen of the source region and the drain region of the active layer ranges from about $10^{18}/cm^3$ to about $10^{21}/cm^3$.

In one embodiment, the substrate is a plastic substrate.

In one embodiment, the active layer is transparent to light.

In one embodiment, the TFT further includes a gate insulating layer disposed on the active layer to be between the gate electrode and the active layer, wherein the gate electrode is disposed on the gate insulating layer.

According to another embodiment of the present invention, there is provided a TFT including: a substrate; a gate electrode disposed on the substrate; an active layer including a material selected from the group consisting of ZnO, InZnO, ZnSnO, and ZnInGaO and insulated from the gate electrode, the active layer having a channel region, a source region, and a drain region; a source electrode insulated from the gate electrode and electrically connected to the source region of the active layer; and a drain electrode insulated from the gate electrode and electrically connected to the drain region of the active layer, wherein the source region and the drain region of the active layer include hydrogen.

In one embodiment, a concentration of hydrogen of the source region and the drain region of the active layer ranges from about $10^{18}/cm^3$ to about $10^{21}/cm^3$.

In one embodiment, the substrate is a plastic substrate.

In one embodiment, the active layer is transparent to light.

In one embodiment, the TFT further includes a gate insulating layer disposed on the active layer to be between the gate electrode and the active layer, wherein the gate electrode is disposed on the gate insulating layer.

According to another embodiment of the present invention, there is provided a method of manufacturing a thin film transistor (TFT). The method includes: forming an active layer on a substrate using a material selected from the group consisting of ZnO, InZnO, ZnSnO, and ZnInGaO, the active layer having a channel region, a source region, and a drain region; forming a gate insulating layer to cover the active layer; forming a gate electrode on the gate insulating layer; implanting hydrogen ions on the gate insulating layer in order to inject hydrogen into the source region and the drain region of the active layer; and forming a source electrode and a drain electrode to be electrically connected to the source region and the drain region of the active layer, respectively.

In one embodiment, during the implanting of the hydrogen ions, a hydrogen ion dose ranges from about $10^{16}/cm^2$ to about $10^{18}/cm^2$.

In one embodiment, during the implanting of the hydrogen ions, an injection energy of the hydrogen ions ranges from about 50 keV to about 150 keV.

In one embodiment, the method further comprises heat treating the active layer after the implanting of the hydrogen ions.

In one embodiment, the heat treating of the active layer after the implanting of the hydrogen ions includes heat treating the active layer at a temperature of about 200° C.

According to another embodiment of the present invention, there is provided a method of manufacturing a thin film transistor (TFT). The method includes: forming a gate electrode on a substrate; forming a gate insulating layer to cover the gate electrode; forming an active layer comprising a channel region, a source region, and a drain region on the gate insulating layer using a material selected from the group consisting of ZnO, InZnO, ZnSnO, and ZnInGaO; forming an interlayer insulating layer to cover the active layer; implanting hydrogen ions into the interlayer insulating layer to inject hydrogen ions into the source region and the drain region of the active layer; and forming a source electrode and a drain electrode to be electrically connected to the source region and the drain region of the active layer, respectively.

In one embodiment, during the implanting of the hydrogen ions, a hydrogen ion dose ranges from about $10^{16}/cm^2$ to about $10^{18}/cm^2$.

In one embodiment, during the implanting of the hydrogen ions, an injection energy of the hydrogen ions ranges from about 50 keV to about 150 keV.

In one embodiment, the method further comprises heat treating the active layer after the implanting of the hydrogen ions.

In one embodiment, the heat treating of the active layer after the implanting of the hydrogen ions includes heat treating the active layer at a temperature of about 200° C.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
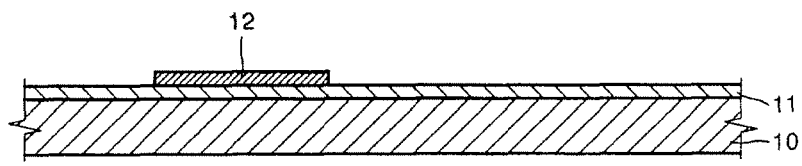
FIGS. 1A, 1B, 1C, 1D, 1E, 1F, and 1G are cross-sectional views illustrating a method of manufacturing a thin film transistor (TFT) according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Hereinafter, like reference numerals refer to like elements, FIGS. 1A through 1G are cross-sectional views illustrating a method of manufacturing a thin film transistor (TFT) according to an embodiment of the present invention.

First, as illustrated in FIG. 1A, an active layer 12 is formed on a buffer layer 11 that is formed on a substrate 10. The substrate 10 may be glass or other various plastic substrates such as acryl. When a TFT is formed on the substrate 10 and a display device is formed on the TFT such that light passes through the TFT and is output to the outside, a transparent substrate may be used. Alternatively, a reflective substrate such as metal may be used as the substrate 10 after forming a TFT on the substrate 10 and a display device on the TFT. In this case, various suitable modifications depending on various purposes can be made, for example, a modification can be made such that light passes through the TFT between the display device and the substrate to enable optical resonance.

A patterned active layer 12 is formed on the buffer layer 11. The patterned active layer 12 may be formed of a semiconductor oxide, specifically, of a material including ZnO such as ZnO, InZnO, ZnSnO or ZnInGaO. However, the present invention is not limited thereto, and other materials having characteristics of a semiconductor can be used to form the patterned active layer 12. The patterned active layer 12 can be formed in a pattern as illustrated in FIG. 1A by using a deposition method using a mask or by forming a semiconductor material corresponding to the entire upper surface of the substrate 10 and then patterning the semiconductor material.

Figure 1B:
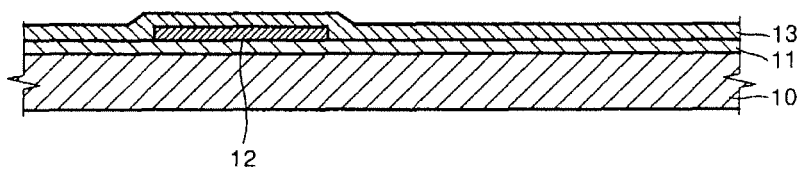

After forming the patterned active layer 12, a gate insulating layer 13 is formed on the active layer 12 and the buffer layer 11 as illustrated in FIG. 1B.

The gate insulating layer 13 can be formed using various suitable materials such as an organic material like parylene or epoxy having insulation characteristics. Also the gate insulating layer 13 may be formed of an inorganic material, and if the gate insulating layer 13 needs to be relatively dense, the gate insulating layer 13 may be formed using silicon oxide or silicon nitride.

Figure 1C:
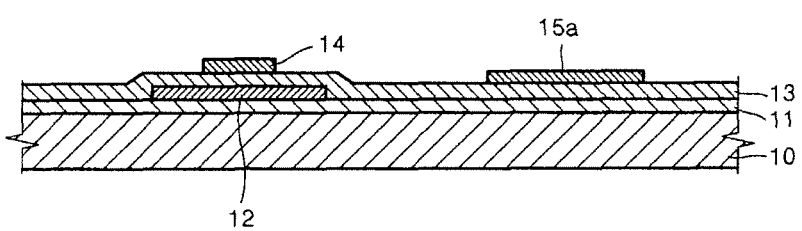

Then, a gate electrode 14 and a bottom electrode 15a of a capacitor 15 are formed on the gate insulating layer 13 as illustrated in FIG. 1C. The gate electrode 14 and the bottom electrode 15a of the capacitor may be formed of a conductive material such as Al, Mo, W, Cr, Ni or compounds thereof. In one embodiment, if light needs to pass through other elements besides the active layer 12 of the TFT, the gate electrode 14 and the bottom electrode 15a of the capacitor 15 may be formed using various transparent conductive materials such as indium tin oxide (ITO) and/or indium zinc oxide (IZO). The gate electrode 14 and the bottom electrode 15a of the capacitor 15 can be formed as a single layer structure or a multi-layer structure.

Figure 1D:
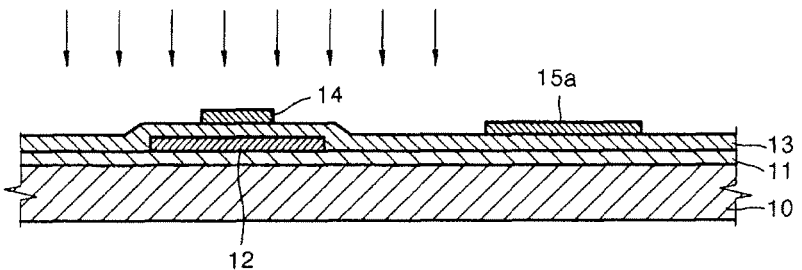

After forming the gate electrode 14, hydrogen ions can be implanted into the active layer 12 using the gate electrode 14 as a self-aligned mask as illustrated in FIG. 1D. Then, as the gate electrode 14 covers a channel region of the active layer 12, a source region 12b and a drain region 12c of the active layer 12 can be doped with ions while hydrogen ions are implanted as illustrated in FIG. 1E.

In one embodiment of the present embodiment, the hydrogen ion dose is in the range from $10^{16}/cm^2$ to about $10^{18}/cm^2$, and the hydrogen ion injection energy is between 50 keV to 150 keV. In one embodiment, when the hydrogen ion dose is lower than $10^{16}/cm^2$, the improvement of contact resistance is low. In another embodiment, when the hydrogen ion dose is higher than $10^{18}/cm^2$, the solubility limit is exceeded, thereby reducing doping efficiency. In one embodiment, when the hydrogen ion injection energy is lower than 50 keV, the injection depth of the dose from the surface is decreased. In another embodiment, when the hydrogen ion injection energy is higher than 150 keV, the cost of a suitable ion injection equipment increases.

Figure 1E:
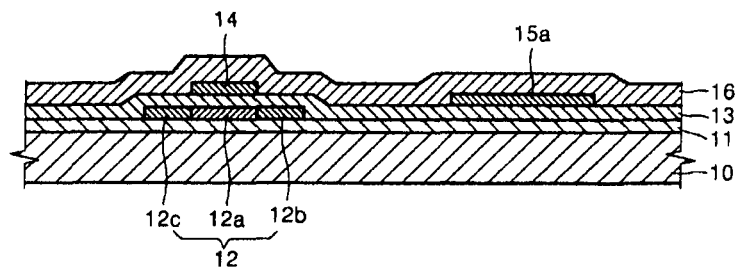

Accordingly, as illustrate in FIG. 1E, the source region 12b and the drain region 12c of the active layer 12 can be made of n+ layer for forming an ohmic contact.

Accordingly, the hydrogen concentration of the source region 12b and the drain region 12c of the active layer 12 may be set to be in the range from $10^{18}/cm^3$ to $10^{21}/cm^3$. In one embodiment, when the hydrogen concentration of the source region 12b and the drain region 12c of the active layer 12 is lower than $10^{18}/cm^3$, the improvement of contact resistance is low. In another embodiment, when the hydrogen concentration is higher than $10^{21}/cm^3$, the solubility limit is exceeded, thereby reducing doping efficiency.

According to the embodiment of FIG. 1E, no additional activation process is needed after the process for hydrogen ion implanting of the active layer 12 as described above.

Accordingly, the present invention can be applied to a plastic substrate to which a high temperature heat treatment process cannot be applied.

In one embodiment of the present invention, during an activation process after implanting hydrogen ions into the active layer 12, a low temperature heat treatment at a temperature of 200° C. or lower on the active layer 12 is sufficient for obtaining an activation effect. Accordingly, despite the heat treatment, this embodiment of the present invention can be applied to a plastic substrate.

Figure 1F:
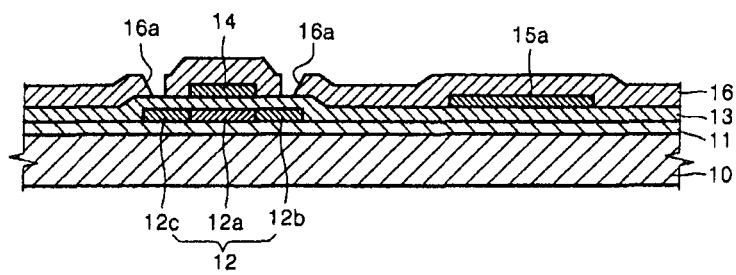
Figure 1G:
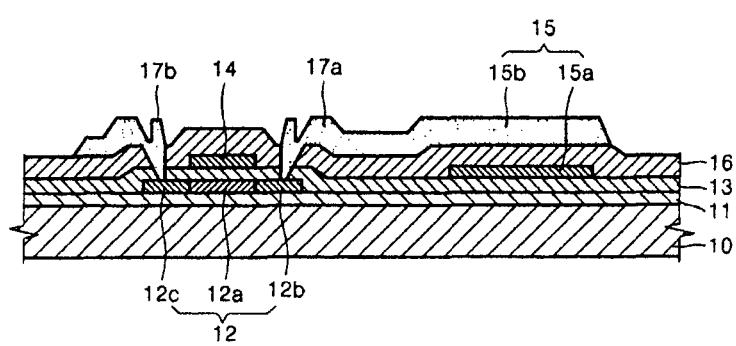

After the hydrogen ion injection process as described above, an interlayer insulating layer 16 is formed to cover the gate electrode 14 and the bottom electrode 15a of the capacitor 15 as illustrated in FIG. 1E, and then contact holes 16a of the interlayer insulating layer 16 are formed as illustrated in FIG. 1F. Hence, a source electrode 17a and a drain electrode 17b are formed on the interlayer insulating layer 16 as illustrated in FIG. 1G. While the source electrode 17a is formed, a top electrode 15b of the capacitor 15 is formed as one unit with the source electrode 17a.

The source electrode 17a, the drain electrode 17b, and the top electrode 15b of the capacitor 15 can be formed of various suitable conductive materials, such as Al, Mo, W, Cr, Ni or compounds thereof and/or various suitable transparent conductive materials, such as ITO and/or IZO, as a single layer structure or a multi-layer structure.

After manufacturing the TFT, an organic light emitting device (or organic light emitting diode) is further stacked to contact the drain electrode 17b to form an organic light emitting display device.

In this case, since the active layer 12 of the TFT is transparent, the TFT can be applied to a bottom emitting device in which light is emitted toward (or in a direction of) the substrate 10.

FIGS. 2A through 2H are cross-sectional views illustrating a method of manufacturing a TFT according to another embodiment of the present invention.

Figure 2A:
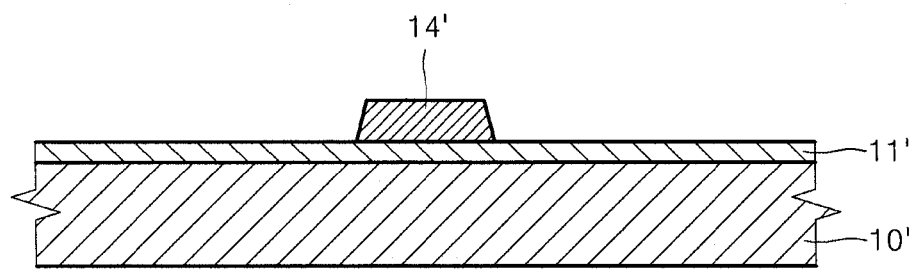
FIGS. 2A, 2B, 2C, 2D, 2E, 2F, 2G, and 2H are cross-sectional views illustrating a method of manufacturing a TFT according to another embodiment of the present invention.

First, as illustrated in FIG. 2A, a gate electrode 14' and a buffer layer 11' are both formed on the substrate 10' in a manner that is substantially the same as described above with reference to FIGS. 1A, 1B, and/or 1C.

Figure 2B:
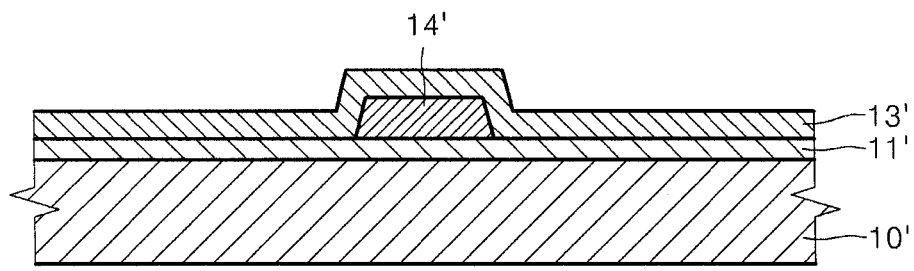

After forming the gate electrode 14', a gate insulating layer 13' is formed on the gate electrode 14' and the buffer layer 11' as illustrated in FIG. 2B. In FIG. 2B, the gate insulating layer 13' is illustrated to cover the gate electrode 14'; however, the method of manufacturing the TFT according to the current embodiment is not limited thereto.

Figure 2C:
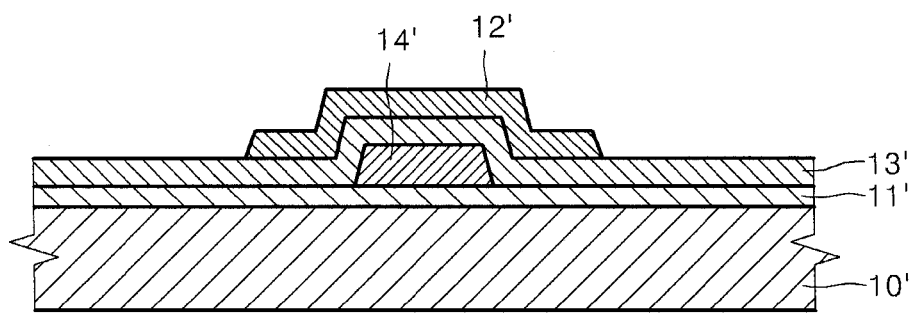

After forming the gate insulating layer 13', a patterned active layer 12' is formed on the gate insulating layer 13' as illustrated in FIG. 2C. The patterned active layer 12' can be formed of an oxide semiconductor material that is substantially the same as described above with reference to the active layer 12.

Figure 2D:
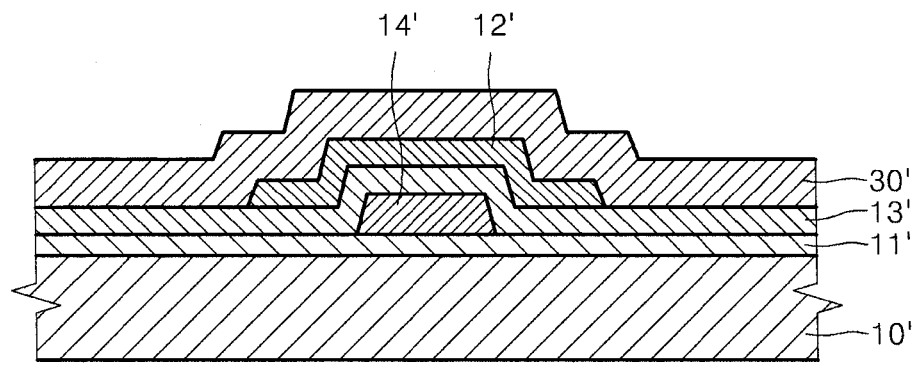
Figure 2E:
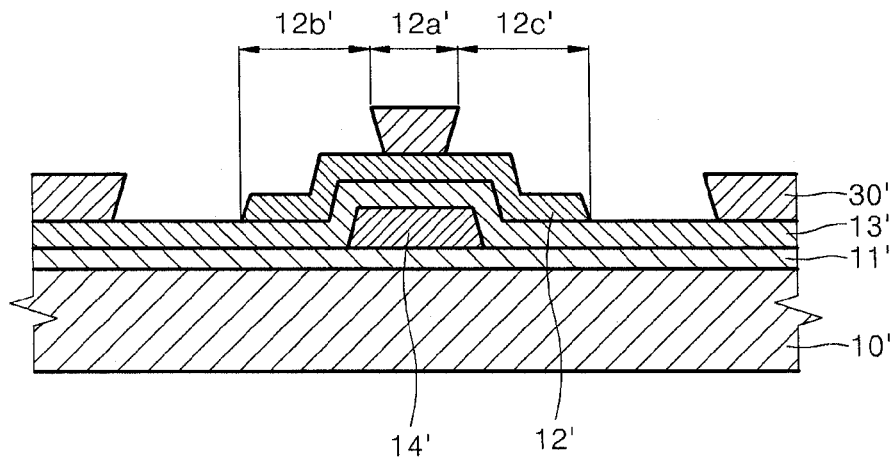

After forming the patterned active layer 12', a photoresist layer 30' is formed on the patterned active layer 12' to expose a source region 12b' and a drain region 12c' of the patterned active layer 12'. In more detail, as illustrated in FIG. 2D, the photoresist layer 30' is formed on an entire surface of the substrate 10 (e.g., on the patterned active layer 12' and the gate insulating layer 13'), and then the photoresist layer 30' is patterned to expose the source region 12b' and the drain region 12c' of the patterned active layer 12' as illustrated in FIG. 2E. The photoresist layer 30 can be patterned using a suitable photolithography method.

Figure 2F:
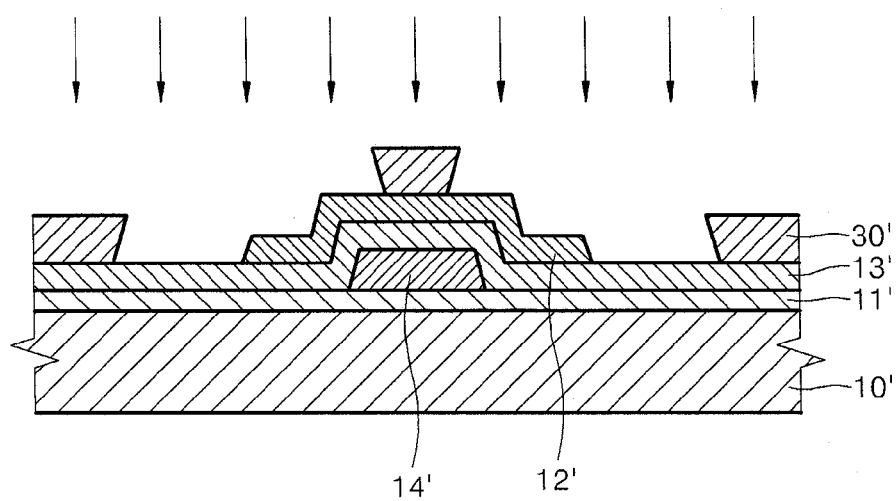

Then, as illustrated in FIG. 2F, by covering a channel region 12a' of the patterned active layer 12' with the patterned photoresist layer 30' that acts as a mask, hydrogen ions are implanted into the exposed source region 12b' and the drain region 12c' of the patterned active layer 12'. In the present embodiment, an interlayer insulating layer is further formed before forming the photoresist layer 30', and then the photoresist layer 30' may be formed and patterned as described above. The hydrogen ions implanting is the same (or substantially the same) as described above and thus will not be described again.

Figure 2G:
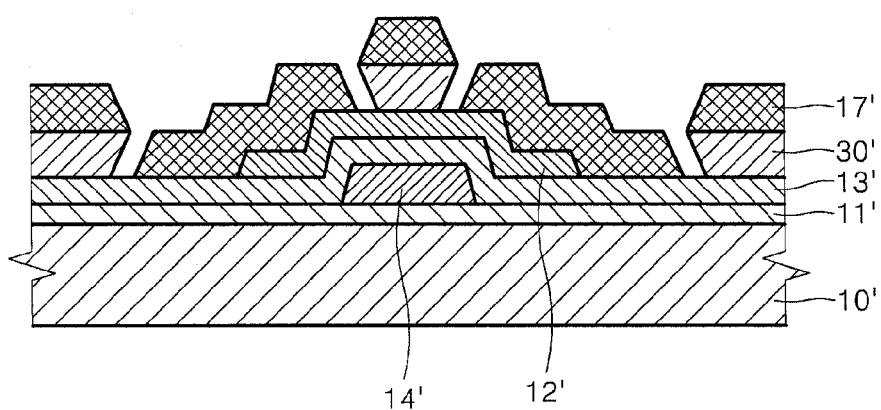

Then, a conductive layer 17' corresponding to an entire surface of the substrate 10' is formed as illustrated in FIG. 2G. Due to the presence of the patterned photoresist layer 30', the conductive layer 17' is not formed as one unit so as to correspond to the entire surface of the substrate 10'; however, the conductive layer 17' is formed on the patterned photoresist layer 30' and on the exposed source region 12b', the drain region 12c' and the channel region 12a' of the patterned active layer 12'. The conductive layer 17' that is formed on the exposed source region 12b' and the drain region 12c' of the patterned active layer 12', and the conductive layer 17' formed on the patterned photoresist layer 30' is separated as illustrated in FIG. 2G due to a step difference of the patterned photoresist layer 30'. The conductive layer 17' may be formed of various suitable conductive materials, such as Al, Mo, W, Cr, Ni or compounds thereof and/or various suitable transparent conductive materials, such as ITO or IZO, as a single layer structure or a multi-layer structure.

Figure 2H:
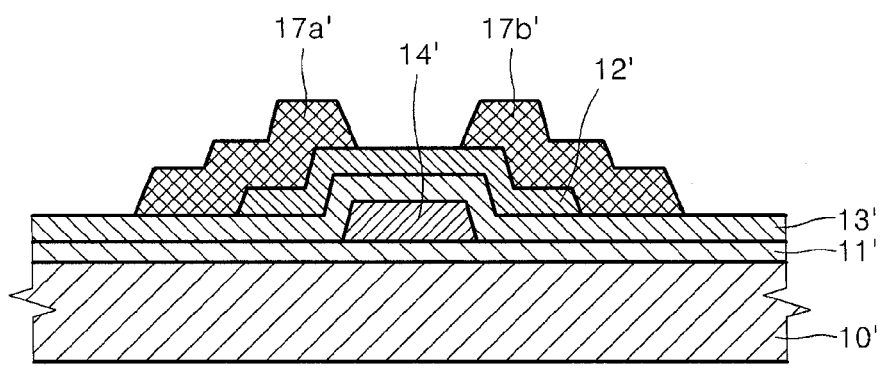

Then, the patterned photoresist layer 30' is removed using a lift-off method in order to pattern the conductive layer 17' as illustrated in FIG. 2H. In other words, a source electrode 17a' contacting the source region 12b' of the patterned active layer 12' and a drain electrode 17b' contacting the drain region 12c' of the patterned active layer 12' are formed.

In view of foregoing and according to an embodiment of the present invention, a photoresist layer is used for implanting a source region and a drain region of an active layer (e.g., the active layer 12, 12') with hydrogen ions as described above, and the photoresist layer is also consequently used for forming a source electrode and a drain electrode of a conductive layer. Thus, unlike a conventional TFT manufacturing method, which requires a doping process on semiconductor layers and a patterning process or mask process for forming a source electrode and a drain electrode, only one patterning process or one mask process, that is, a patterning of the photoresist layer, is needed according to the embodiment of the present invention. Thus, manufacturing costs are reduced and yield is increased.

In addition, according to a method of manufacturing a TFT according to an embodiment of the present invention as described above, the TFT is provided to have a source electrode, a drain electrode, and an active layer; and in which an ohmic contact can be formed between the source electrode and the active layer, or between the drain electrode and the active layer.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor (TFT) comprising:
a plastic substrate;
an active layer disposed on the plastic substrate and comprising a channel region, a source region, and a drain region, the active layer including a material selected from the group consisting of InZnO, ZnSnO, and ZnInGaO;
a gate electrode insulated from the active layer;
a source electrode insulated from the gate electrode and electrically connected to the source region of the active layer; and
a drain electrode insulated from the gate electrode and electrically connected to the drain region of the active layer,
wherein the source region and the drain region of the active layer comprise hydrogen, and
wherein a concentration of hydrogen of the source region and the drain region of the active layer ranges from about $10^{18}/cm^3$ to about $10^{21}/cm^3$, and
wherein the active layer is transparent to light.

2. The TFT of claim 1, further comprising a gate insulating layer disposed on the active layer to be between the gate electrode and the active layer, wherein the gate electrode is disposed on the gate insulating layer.

* * * * *